(12) United States Patent
He et al.

(10) Patent No.: US 11,158,628 B2
(45) Date of Patent: Oct. 26, 2021

(54) ELECTRO-STATIC DISCHARGE CIRCUIT, ARRAY SUBSTRATE, DISPLAY PANEL AND DISPLAY APPARATUS

(71) Applicant: Xiamen Tianma Micro-Electronics Co., Ltd., Xiamen (CN)

(72) Inventors: Shui He, Xiamen (CN); Zhaokeng Cao, Shanghai (CN); Yinghua Mo, Shanghai (CN); Xiao Li, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 11 days.

(21) Appl. No.: 16/732,273

(22) Filed: Dec. 31, 2019

(65) Prior Publication Data

US 2021/0098446 A1  Apr. 1, 2021

(30) Foreign Application Priority Data

Sep. 29, 2019 (CN) .......................... 201910936788.X (51) Int. Cl.
*H01L 27/02* (2006.01)
*H01L 29/00* (2006.01)
*H01L 27/12* (2006.01)
*H01L 29/786* (2006.01)
(Continued)

(52) U.S. Cl.
CPC ........ *H01L 27/0266* (2013.01); *H01L 27/124* (2013.01); *H01L 27/1222* (2013.01); *H01L 27/1225* (2013.01); *H01L 29/7869* (2013.01); *H01L 29/78675* (2013.01);
(Continued)

(58) Field of Classification Search
CPC ......... H01L 21/02675; H01L 21/76883; H01L 21/77; H01L 27/0266; H01L 27/1222; H01L 27/1225; H01L 27/124; H01L 27/1274; H01L 29/78675; H01L 29/7869; H01L 29/66757
See application file for complete search history.

(56) References Cited

U.S. PATENT DOCUMENTS 5,272,586 A * 12/1993 Yen ........................ H02H 9/046
361/111
5,698,873 A * 12/1997 Colwell ............ H01L 27/11807
257/204

(Continued)

FOREIGN PATENT DOCUMENTS

CN       102651547 B    6/2013
CN       106098684 A    11/2016

*Primary Examiner* — Nikolay K Yushin
(74) *Attorney, Agent, or Firm* — Kilpatrick Townsend & Stockton, LLP (57) ABSTRACT

Disclosed are an electro-static discharge circuit, an array substrate, a display panel and a display apparatus. The electro-static discharge circuit includes a first transistor, a second transistor, a first switching device and a second switching device. A first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line.

18 Claims, 10 Drawing Sheets

(51) Int. Cl.
*H01L 21/02* (2006.01)
*H01L 29/66* (2006.01)

(52) U.S. Cl.
CPC .... *H01L 21/02675* (2013.01); *H01L 27/1274* (2013.01); *H01L 29/66757* (2013.01)

(56) References Cited

U.S. PATENT DOCUMENTS

| | | | |
|---|---|---|---|
| 9,136,700 B2* | 9/2015 | Tseng ..................... | H02H 9/041 |
| 2014/0071109 A1* | 3/2014 | Tseng ..................... | H02H 9/041 |
| | | | 345/211 |

* cited by examiner

ELECTRO-STATIC DISCHARGE CIRCUIT, ARRAY SUBSTRATE, DISPLAY PANEL AND DISPLAY APPARATUS

CROSS-REFERENCE TO RELATED APPLICATION

This application claims the priority to Chinese Patent Application No. 201910936788.X, filed on Sep. 29, 2019, the disclosure of which is incorporated herein by reference in its entirety.

FIELD

Embodiments of the present disclosure relate to a display technology and, in particular, relate to an electro-static discharge circuit, an array substrate, a display panel and a display apparatus.

BACKGROUND

In production, testing and transporting processes of a thin film transistor (TFT) display screen, instantaneous static electricity of up to kilovolts can be generated due to friction or contact and other reasons. Due to the fact that the glass of a display screen is an insulator, the static electricity can easily cause a short circuit inside the display screen, and therefore an electro-static discharge (ESD) protection circuit is necessary.

SUMMARY

Embodiments of the present disclosure provide an electro-static discharge circuit, an array substrate, a display panel and a display apparatus.

In one embodiment, an electro-static discharge circuit is provided in the embodiments of the present disclosure and includes a first transistor, a second transistor, a first switching device and a second switching device.

A first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line, where when the first switching device is conductive, the first transistor discharges charges accumulated on the signal line to the first level line.

A first end of the second transistor is electrically connected to the signal line, a second end of the second transistor is electrically connected to a second level line, a control end of the second transistor is electrically connected to a first end of the second switching device, a second end of the second switching device is electrically connected to the signal line, and a control end of the second switching device is electrically connected to the second level line, where when the second switching device is conductive, the second transistor discharges charges accumulated on the signal line to the second level line.

In one embodiment, an array substrate is further provided in the embodiments of the present disclosure and includes an electro-static discharge circuit.

The electro-static discharge circuit includes a first transistor, a second transistor, a first switching device and a second switching device. A first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line, where when the first switching device is conductive, the first transistor discharges charges accumulated on the signal line to the first level line. A first end of the second transistor is electrically connected to the signal line, a second end of the second transistor is electrically connected to a second level line, a control end of the second transistor is electrically connected to a first end of the second switching device, a second end of the second switching device is electrically connected to the signal line, and a control end of the second switching device is electrically connected to the second level line, where when the second switching device is conductive, the second transistor discharges charges accumulated on the signal line to the second level line.

In one embodiment, a display panel is further provided in the embodiments of the present disclosure and includes an array substrate, and the array substrate includes an electro-static discharge circuit.

The electro-static discharge circuit includes a first transistor, a second transistor, a first switching device and a second switching device. A first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line, where when the first switching device is conductive, the first transistor discharges charges accumulated on the signal line to the first level line. A first end of the second transistor is electrically connected to the signal line, a second end of the second transistor is electrically connected to a second level line, a control end of the second transistor is electrically connected to a first end of the second switching device, a second end of the second switching device is electrically connected to the signal line, and a control end of the second switching device is electrically connected to the second level line, where when the second switching device is conductive, the second transistor discharges charges accumulated on the signal line to the second level line.

In one embodiment, a display apparatus is further provided in the embodiments of the present disclosure and includes a display panel, and the display panel includes an array substrate, and the array substrate includes an electro-static discharge circuit.

The electro-static discharge circuit includes a first transistor, a second transistor, a first switching device and a second switching device. A first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line, where when the first switching device is conductive, the first transistor discharges charges accumulated on the signal line to the first level line. A first end of the second transistor is electrically connected to the signal line, a second end of the second transistor is electrically connected to a second level line, a control end of the second transistor is electrically connected to a first end of the second switching device, a second end of the second switching device is electrically connected to the signal line, and a control end of the second switching device is electrically connected to the second level line, where when the second switching device is conductive, the second transistor discharges charges accumulated on the signal line to the second level line.

DETAILED DESCRIPTION

Hereinafter the present disclosure will be further described in detail in conjunction with the drawings and embodiments. The embodiments set forth below are merely intended to illustrate and not to limit the present disclosure. Additionally, it is to be noted that, for ease of description, only part, not all, of the structures related to the present disclosure are illustrated in the drawings.

Terms used in the embodiments of the present disclosure are merely used to describe specific embodiments and not intended to limit the present disclosure. It is to be noted that nouns of locality, including "on", "below", "left" and "right", used in the embodiments of the present disclosure are described from the angles shown in the drawings, and are not to be construed as a limitation to the present disclosure.

In addition, in the context, when an element is formed "on" or "below" another element, the element may not only be directly formed "on" or "below" another element, and may also be indirectly formed "on" or "below" another element via an intermediate element. The terms "first", "second" and the like are only used for description and used to distinguish between different components rather than indicate any order, quantity, or importance.

In the related art, TFTs made with poly-silicon semiconductors have been widely used.

When an electro-static discharge protection circuit is researched, the applicant found that a poly-silicon thin film resistor connected in series to a gate electrode of the TFT can improve the dredging ability of ESD, however, due to the fact that the resistance of the poly-silicon thin film serving as the resistor in the ESD protection circuit is small, the voltage division effect of the resistor is low, and the gate electrode of the TFT is in a case of positive or negative bias voltage for a long time, so that the characteristics of the TFT are degraded, and the ESD protection performance is affected.

Figure 1:
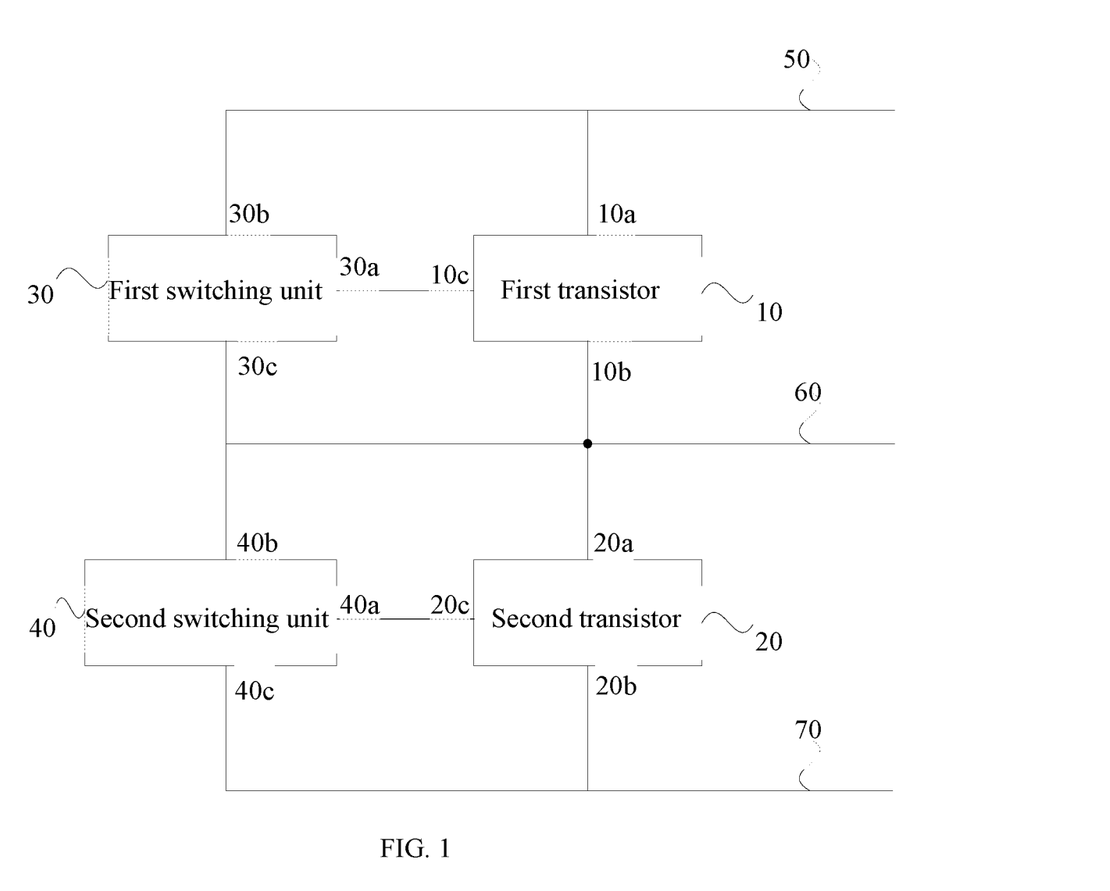
FIG. 1 is a structural diagram of an electro-static discharge circuit according to an embodiment of the present disclosure.

In view of this, an electro-static discharge circuit structure is provided in the present disclosure. Referring to FIG. 1, FIG. 1 is a structural diagram of an electro-static discharge circuit according to an embodiment of the present disclosure. An electro-static discharge circuit provided in the embodiment includes a first transistor 10, a second transistor 20, a first switching device 30 and a second switching device 40. A first end 10a of the first transistor 10 is electrically connected to a first level line 50, a second end 10b of the first transistor 10 is electrically connected to a signal line 60, a control end 10c of the first transistor 10 is electrically connected to a first end 30a of the first switching device 30, a second end 30b of the first switching device 30 is electrically connected to the first level line 50, and a control end 30c of the first switching device 30 is electrically connected to the signal line 60, where when the first switching device 30 is conductive, the first transistor 10 discharges charges accumulated on the signal line 60 to the first level line 50. A first end 20a of the second transistor 20 is electrically connected to the signal line 60, a second end 20b of the second transistor 20 is electrically connected to a second level line 70, a control end 20c of the second transistor 20 is electrically connected to a first end 40a of the second switching device 40, a second end 40b of the second switching device 40 is electrically connected to the signal line 60, and a control end 40c of the second switching device 40 is electrically connected to the second level line 70, where when the second switching device 40 is conductive, the second transistor 20 discharges charges accumulated on the signal line 60 to the second level line 70.

The electro-static discharge circuit provided in the embodiment of the present disclosure may be used in a display panel, for example, is disposed in a non-display region on a border of the display panel, and is used for leading static electricity generated on the signal line inside the display panel to a ground terminal or the like to prevent damage of the static electricity to circuits in the display panel. In one embodiment of the present disclosure, the signal line includes a data signal line and a scanning signal line of the display panel. Exemplarily, when a voltage on the first level line 50 is higher than a voltage on the second level line 70 and when no electro-static charge is accumulated on the signal line 60, a voltage on the signal line 60 is located between the voltage of the first level line 50 and the voltage of the second level line 70, and at this time, the first transistor 10, the second transistor 20, the first switching device 30 and the second switching device 40 each are in a closed state. When positive charges are accumulated on the signal line 60 due to static electricity, the voltage on the signal line 60 increases, and when enough positive charges are accumulated on the signal line 60, a voltage difference between the signal line 60 and the first level line 50 causes the first switching device 30 to be conductive, the voltage on the first level line 50 is applied to the control end 10c of the first transistor 10, then the first transistor 10 is conductive, and the positive charges accumulated on the signal line 60 are led into the first level line 50 through the first transistor 10 to discharge the positive charges. Similarly, when negative charges are accumulated on the signal line 60 due to static electricity, the voltage on the signal line 60 decreases, and when enough negative charges are accumulated on the signal line 60, a voltage difference between the signal line 60 and the second level line 70 causes the second switching device 40 to be conductive, the voltage on the second level line 70 is applied to the control end 20c of the second transistor 20, then the second transistor 20 is conductive, and the negative charges accumulated on the signal line 60 are led into the second level line 70 through the second transistor 20 to discharge the negative charges. The first switch device 30 and the second switch device 40 are disposed, so that when no static electricity needs to be discharged, the first switching device 30 and the second switching device 40 are closed, and the control end 10c of the first transistor 10 and the control end 20c of the second transistor 20 are not in a voltage bias state for a long time and thus threshold deviation of the transistor is not caused, which is beneficial for improving the stability and service life of the electro-static discharge circuit.

The electro-static discharge circuit structure is provided in the embodiments of the present disclosure. When the first switching device is conductive, the first transistor discharges charges accumulated on the signal line to the first level line, and when the second switching device is conductive, the second transistor discharges the charges accumulated on the signal line to the second level line. The first switching device is disposed between the first end of the first transistor and the control end of the first transistor, the second switching device is disposed between the first end of the second transistor and the control end of the second transistor, when no static electricity is accumulated on the signal line, the first switching device and the second switching device each are in a closed state, so that the control end of the first transistor and the control end of the second transistor can be prevented from being in a voltage bias state for a long time, the performance degradation of the first transistor and the second transistor is avoided, and the stability of the electro-static discharge circuit is improved.

Figure 2:
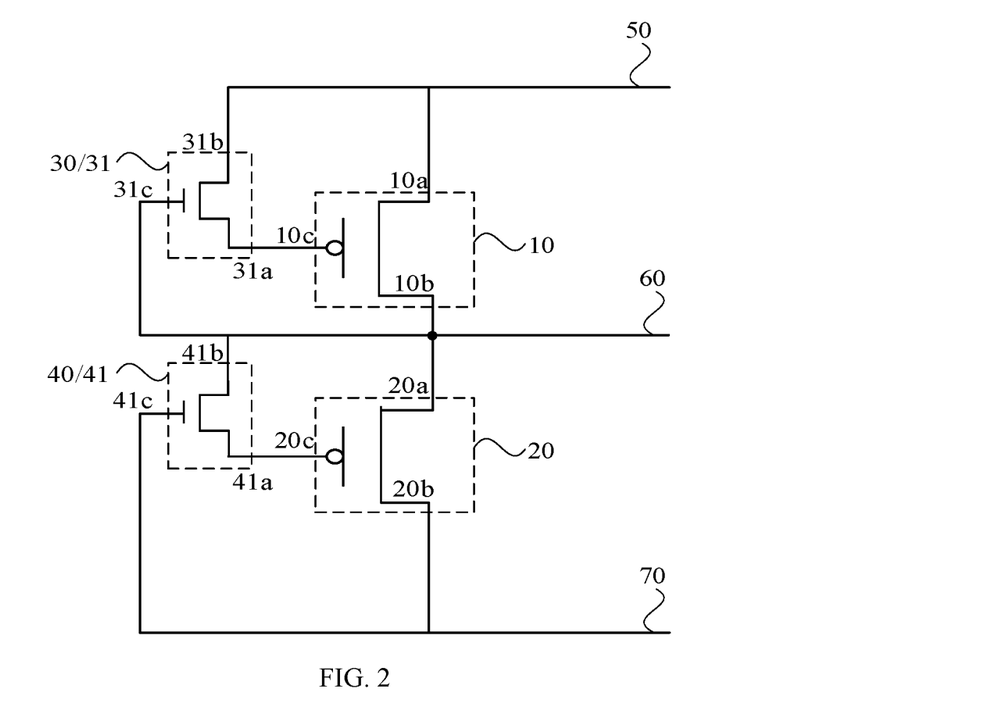
FIG. 2 is a structural diagram of another electro-static discharge circuit according to an embodiment of the present disclosure.

On the basis of the above-described embodiment, FIG. 2 is a structural diagram of another electro-static discharge circuit according to an embodiment of the present disclosure. Referring to FIG. 2, in one embodiment of the present disclosure, the first transistor 10 and the second transistor 20 each are a P-type transistor, the first switching device 30 includes at least one N-type transistor, and the second switching device 40 includes at least one N-type transistor.

It is to be noted that FIG. 2 exemplarily shows a case where the first switching device 30 and the second switching device 40 respectively include one N-type transistor 31 and one N-type transistor 41, which is not intended to limit the present disclosure.

Exemplarily, in the embodiment shown in FIG. 2, the case where a voltage of the first level line 50 is higher than a voltage of the second level line 70 is taken as an example, the first end 10a of the first transistor 10 is a drain electrode, the second end 10b of the first transistor 10 is a source electrode, and the control end 10c of the first transistor 10 is a gate electrode; the first end 20a of the second transistor 20 is a drain electrode, the second end 20b of the second transistor 20 is a source electrode, and the control end 20c of the second transistor 20 is a gate electrode; a first end 31a of the N-type transistor 31 is a drain electrode, a second end 31b of the N-type transistor 31 is a source electrode, and a control end 30c of the N-type transistor 31 is a gate electrode; and a first end 41a of the N-type transistor 41 is a drain electrode, a second end 41b of the N-type transistor 41 is a source electrode, and a control end 41c of the N-type transistor 41 is a gate electrode. A transistor is divided into an enhancement-mode transistor and a depletion-mode transistor according to whether a conductive channel exists in an initial situation; due to the fact that the depletion-mode transistor has a conductive channel when no voltage is applied to any electrode and that a proper voltage needs to be applied to a gate electrode in a turn-off process, the transistors in the embodiment each are the enhancement-mode transistor. In addition, the drain electrode and the source electrode are the same in structure from the manufacturing perspective of a thin film transistor, and can be used interchangeably.

The electro-static discharge principle of the embodiment is described below with the electro-static discharge circuit shown in FIG. 2.

In the embodiment, the voltage (represented by VGH) of the first level line 50 is configured to be higher than the voltage (represented by VGL) of the second level line 70, and the voltage of the signal line 60 is represented by VESD. In a case where positive charges are accumulated on the signal line 60, the VESD gradually increases. In a case where VESD-VGH (a voltage between the gate electrode 31c and the source 31b of the N-type transistor 31) is greater than a conduction threshold of the N-type transistor 31, the N-type transistor 31 is conductive, a voltage of the gate electrode 10c of the first transistor 10 rises to VGH, and a threshold voltage of the first transistor 10 is smaller than zero due to the fact that the first transistor 10 is a P-type transistor, in a case where VGH-VESD (a voltage between the gate electrode 10c and the source electrode 10b of the first transistor 10) is smaller than a threshold voltage of the first transistor 10, the first transistor 10 is conductive, and positive charges are led into the first level line 50 through the first transistor 10 to discharge the positive charges. In a case where negative charges are accumulated on the signal line 60, the VESD gradually decreases. In a case where VGL-VESD (a voltage between the gate electrode 41c and the source electrode 41b of the N-type transistor 41) is greater than a conduction threshold of the N-type transistor 41, the N-type transistor 41 is conductive, a voltage of the gate electrode 20c of the second transistor 20 drops to VESD, and a threshold voltage of the second transistor 20 is smaller than zero due to the fact that the second transistor 20 is the P-type transistor, in a case where VESD-VGL (a voltage between the gate electrode 20c and the source electrode 20b of the second transistor 20) is smaller than a threshold voltage of the second transistor 20, the second transistor 20 is conductive, and negative charges are led into the second level line 70 through the second transistor 20 to discharge the negative charges.

In one embodiment of the present disclosure, a plurality of N-type transistors in the first switching device are arranged in series or in parallel.

In one embodiment of the present disclosure, a plurality of N-type transistors in the second switching device are arranged in series or in parallel.

Figure 3:
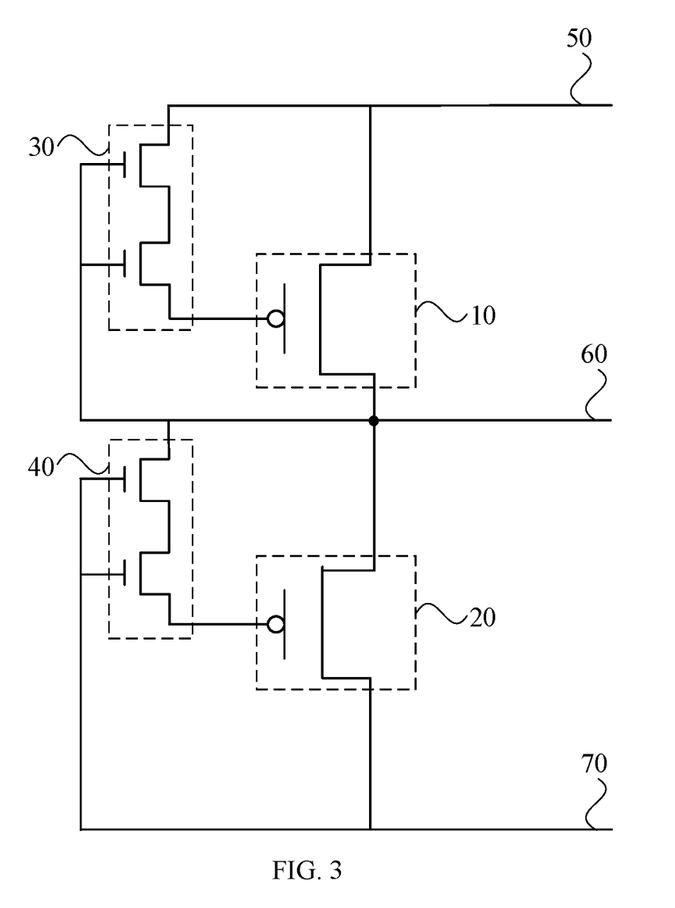
FIG. 3 is a structural diagram of another electro-static discharge circuit according to an embodiment of the present disclosure.
Figure 4:
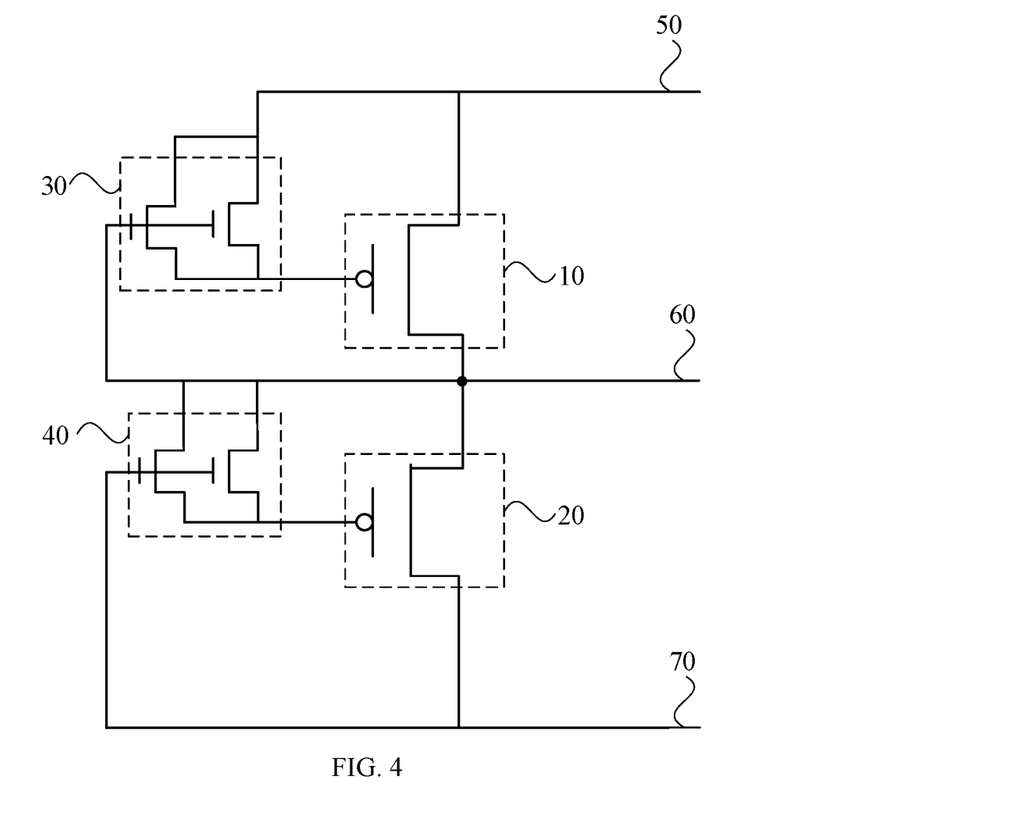
FIG. 4 is a structural diagram of another electro-static discharge circuit according to an embodiment of the present disclosure.

Exemplarily, FIGS. 3 and 4 each are a structural diagram of another electro-static discharge circuit according to an embodiment of the present disclosure. FIGS. 3 and 4 each exemplarily show a case where the first switching device 30 and the second switching device 40 each include two N-type transistors. Referring to FIG. 3, the N-type transistors are arranged in series in the first switching device 30 and in the second switching device 40, respectively, and referring to FIG. 4, the N-type transistors are arranged in parallel in the first switching device 30 and in the second switching device 40, respectively. It is to be noted that, in other embodiments, the plurality of N-type transistors in the first switching device 30 may be arranged in series and the plurality of N-type transistors in the second switching device 40 may be arranged in parallel; and the plurality of N-type transistors in the first switching device 30 may also be arranged in parallel and the plurality of N-type transistors in the second switching device 40 may also be arranged in series, which is not limited in the embodiments. The first switching device and the second switching device each are configured to include the plurality of N-type transistors, so that the isolation performance of a switching device can be enhanced in a case where the electro-static discharge is not needed, and the stability of the electro-static discharge circuit is improved.

In one embodiment of the present disclosure, an active layer of the first transistor, an active layer of the second transistor, an active layer of each N-type transistor in the first switching device, and an active layer of each N-type transistor in the second switching device have a same semiconductor material.

The first transistor, the second transistor, the first switching device, and the second switching device in the embodiment each are a thin film transistor. A proper voltage is applied between the gate electrode and the source electrode of the thin film transistor, so that a conduction channel is generated in a channel region of the active layer and then the conduction may be achieved. In the embodiment, the active layer of the first transistor, the active layer of the second transistor, the active layer of the each N-type transistor in the first switching device, and the active layer of the each N-type transistor in the second switching device may have the same semiconductor material, all active layers are formed by using the same process, and the process difficulty is simplified.

In one embodiment of the present disclosure, the semiconductor material of the active layer of the first transistor, the semiconductor material of the active layer of the second transistor, the semiconductor material of the active layer of each N-type transistor in the first switching device, and the semiconductor material of the active layer of each N-type transistor in the second switching device are one of low temperature poly-silicon and a metal oxide semiconductor.

For the low temperature poly-silicon (LTPS), excimer laser is used as a heat source. After the laser passes through a projection system, a laser beam with uniform energy distribution is generated and is projected onto a glass substrate of an amorphous silicon structure; after energy of the excimer laser is absorbed, the glass substrate is converted from of the amorphous silicon structure into of a poly-silicon structure; the whole processing process is completed below 600° C., so that a general glass substrate is applicable, and a display panel manufactured based on a low-temperature poly-silicon technology, has the benefits of high reaction speed, high brightness, high resolution, low power consumption and the like over an amorphous silicon display panel. The metal oxide semiconductor is a compound semiconductor material formed from metal and oxygen, for example, an n-type indium gallium zinc oxide (IGZO) semiconductor material, a p-type Cu2O, NiO, CoO, FeO, Cr2O3, and the like. Compared with other semiconductor materials, such as an amorphous silicon material, the low-temperature poly-silicon and the oxide semiconductor have higher electron mobility and wider application range. In specific implementation, the semiconductor materials of active layers of the first transistor, the second transistor, the transistor in the first switching device and the transistor in the second switching device each may be one of the low temperature poly-silicon and the metal oxide semiconductor, which is not limited in the embodiment.

In other embodiments, materials of active layers of the first transistor and the second transistor may be different from materials of active layers of the first switching device and the second switching device. In one embodiment of the present disclosure, the active layer of the first transistor and the active layer of the second transistor each are the low temperature poly-silicon, and the semiconductor material of the active layer of the each N-type transistor in the first switching device and the semiconductor material of the active layer of the each N-type transistor in the second switching device each are the metal oxide semiconductor; or the active layer of the first transistor and the active layer of the second transistor each are the metal oxide semiconductor, and the semiconductor material of the active layer of the each N-type transistor in the first switching device and the semiconductor material of the active layer of the each N-type transistor in the second switching device each are the low temperature poly-silicon. A flexible selection may be made in specific implementation according to actual requirements.

An array substrate is further provided in the embodiments of the present disclosure and includes any one of the electro-static discharge circuits provided in the embodiments described above.

The array substrate provided in the embodiment may include a display region and a non-display region surrounding the display region. The display region includes a plurality of sub-pixels arranged in an array and corresponding pixel driving circuits. The electro-static discharge circuit may be provided in the non-display region of the array substrate for discharging static electricity on the signal line (such as, a data signal lines or a scanning signal line) within the pixel driving circuit of the display region.

Figure 5:
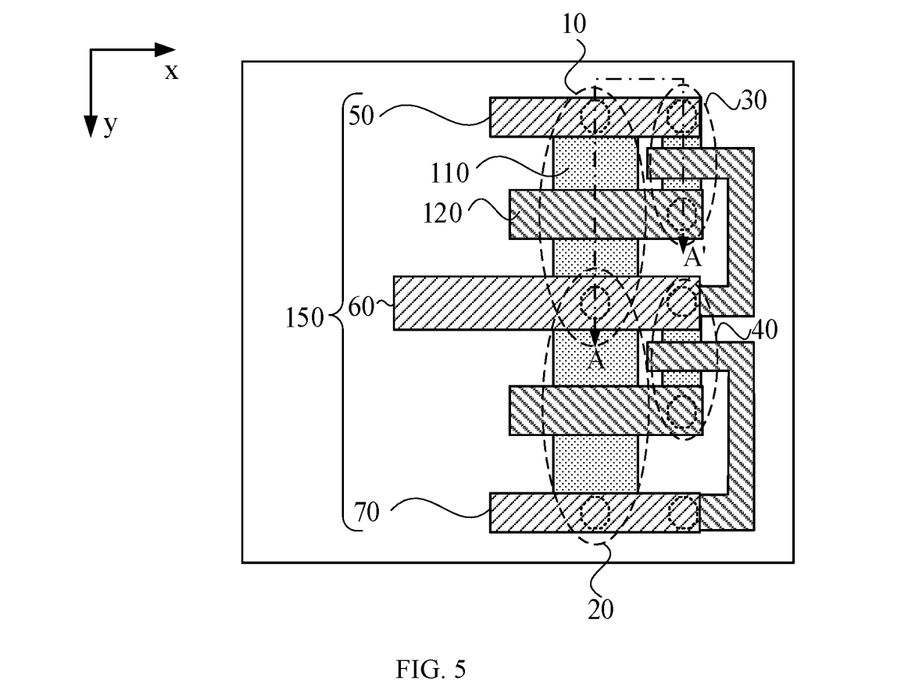
FIG. 5 is a partial structural diagram of an array substrate according to an embodiment of the present disclosure.
Figure 6:
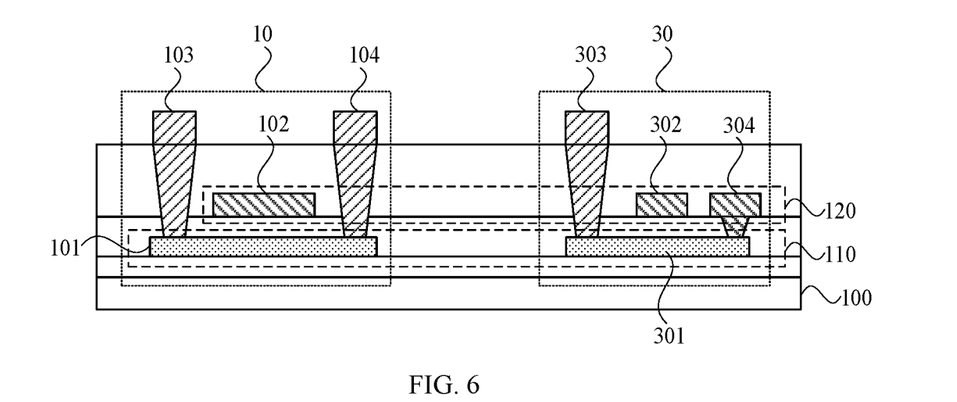
FIG. 6 is a cross-sectional view of FIG. 5 taken along line AA'.

FIG. 5 is a partial structural diagram of an array substrate according to an embodiment of the present disclosure, and FIG. 6 is a cross-sectional view of FIG. 5 taken along line AA'. Referring to FIGS. 5 and 6, in one embodiment of the present disclosure, the array substrate includes a substrate 100 and a first semiconductor layer 110 and a first metal layer 120 stacked on a side of the substrate 100, the first semiconductor layer 110 includes an active layer of a first transistor 10 and an active layer of a second transistor 20, and the first metal layer includes a gate electrode of the first transistor 10 and a gate electrode of the second transistor 20.

In one embodiment of the present disclosure, the first semiconductor layer 110 further includes an active layer of a transistor in a first switching device 30 and an active layer of a transistor in a second switching device 40, and the first metal layer includes a gate electrode of the transistor in the first switching device 30 and a gate electrode of the transistor in the second switching device 40.

FIG. 5 schematically shows a partial top view of an electro-static discharge circuit, and a case where the first switching device 30 and the second switching device 40 each include one N-type transistor is taken as an example. In a case where the first switching device 30 and the second switching device 40 include a plurality of N-type transistors, the structures of the first switching device 30 and the second switching device 40 are similar to those of FIG. 5, and merely the connection relationship of a plurality of transistors needs to be adaptively adjusted. FIG. 6 shows a cross-sectional view of the first transistor 10 and the first switching device 30 in FIG. 5. A structure of the second transistor 20 is the same as that of the first transistor 10, and the structure of the second switching device 40 is the same as that of the first switching device 30. Referring to FIG. 6, the first transistor 10 includes a first active layer 101, a first gate electrode 102, a first source electrode 103, and a first drain electrode 104, and the transistor of the first switching device 30 includes a second active layer 301, a second gate electrode 302, a second source electrode 303 and a second drain electrode 304, where the first active layer 101 and the second active layer 301 are arranged at a same layer, and the first gate electrode 102 and the second gate electrode 302 are arranged at a same layer. In specific implementation, a buffer layer is further included between the substrate 100 and the first semiconductor layer 110, and an insulating layer and other structures are further included between the first semiconductor layer 110 and the first metal layer 120. Arrangement may be made in specific implementation according to actual requirements.

In one embodiment of the present disclosure, the active layer of the first transistor, the active layer of the second transistor, the active layer of the transistor in the first switching device and the active layer of the transistor in the second switching device have a same semiconductor material, and the same semiconductor material is one of low temperature poly-silicon (LTPS) and the third metal layer 150 includes a metal oxide semiconductor.

Exemplarily, with continued reference to FIG. 6, the first semiconductor layer 110 includes a type of semiconductor material, which may be, for example, one of the low temperature poly-silicon and the metal oxide semiconductor. The process can be simplified, a structure of a film layer can be reduced, and the manufacturing difficulty of the array substrate can be reduced by adopting the same semiconductor material. Further, in a case where the metal oxide semiconductor is adopted in all structures of the electro-static discharge circuit, a metal oxide thin film transistor is more stable, and the anti-static capacity of a circuit structure can be improved.

Figure 7:
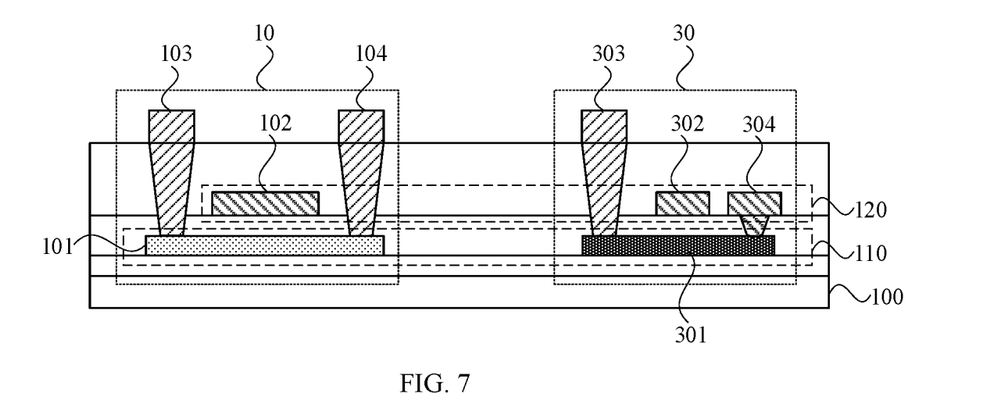
FIG. 7 is another cross-sectional view of FIG. 5 taken along line AA'.

In one embodiment of the present disclosure, FIG. 7 is another cross-sectional view of FIG. 5 taken along line AA'. Referring to FIG. 7, the first semiconductor layer 110 includes two types of semiconductor materials. The active layer of the first transistor and the active layer of the second transistor each are the low temperature poly-silicon, and the active layer of the transistor in the first switching device and the active layer of the transistor in the second switching device each are the metal oxide semiconductor; or the active layer of the first transistor and the active layer of the second transistor each are the metal oxide semiconductor, and the active layer of the transistor in the first switching device and the active layer of the transistor in the second switching device each are the low temperature poly-silicon.

The first semiconductor layer 110 shown in FIG. 7 includes two types of semiconductor materials arranged at the same layer. Similar to FIG. 6, FIG. 7 merely shows a cross-sectional view of the first transistor 10 and the first switching device 30 in FIG. 5. The structure of the second transistor 20 is the same as that of the first transistor 10, and the structure of the second switching device 40 is the same as that of the first switching device 30. Referring to FIG. 7, the first transistor 10 includes the first active layer 101, the first gate electrode 102, the first source electrode 103, and the first drain electrode 104, and the transistor of the first switching device 30 includes the second active layer 301, the second gate electrode 302, the second source electrode 303 and the second drain electrode 304, where the first active layer 101 and the second active layer 301 are arranged at the same layer, and the first gate electrode 102 and the second gate electrode 302 are arranged at the same layer. In an embodiment, the active layer of the first transistor 10 may be the low temperature poly-silicon, and the active layer of the first switching device 30 is the metal oxide semiconductor. In another embodiment, the active layer of the first transistor 10 may be the metal oxide semiconductor, and the active layer of the first switching device 30 is the low temperature poly-silicon. A design may be made in specific implementation according to actual requirements. In a case where the first active layer and the second active layer are arranged at the same layer, compared with a solution that two active layers are arranged at different layers, the solution of arrangement at the same layer may not be provided with the buffer layer between the two active layers, and the thickness of the inorganic layer in the array substrate is reduced, and in a case where the array substrate is applied to a flexible display panel, bending of the flexible display panel is facilitated.

Figure 8:
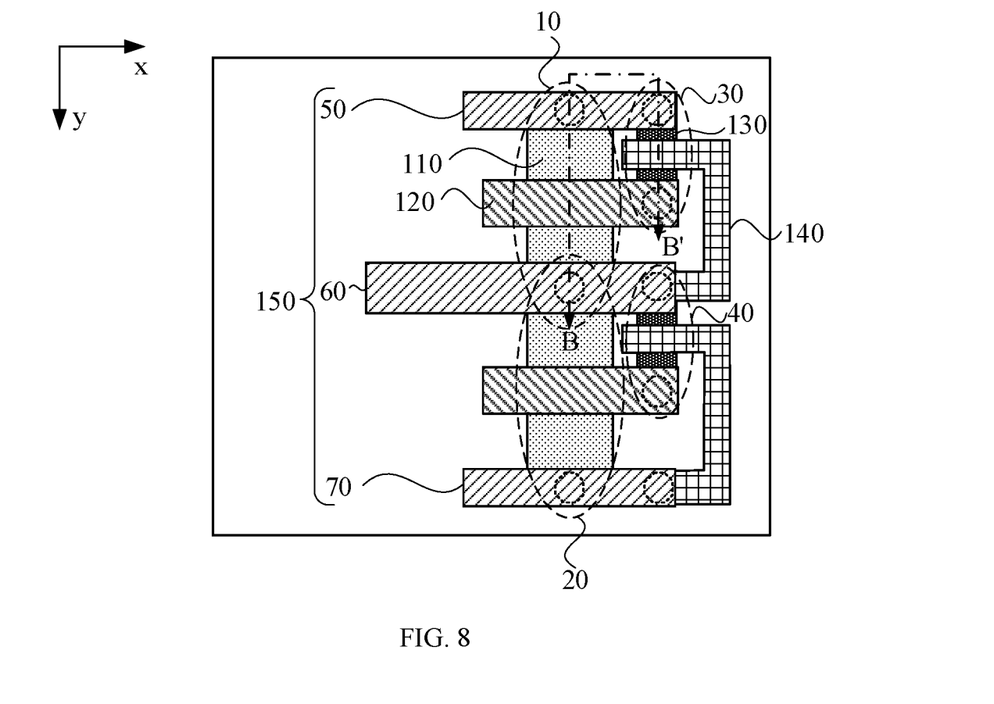
FIG. 8 is a partial structural diagram of another array substrate according to an embodiment of the present disclosure.
Figure 9:
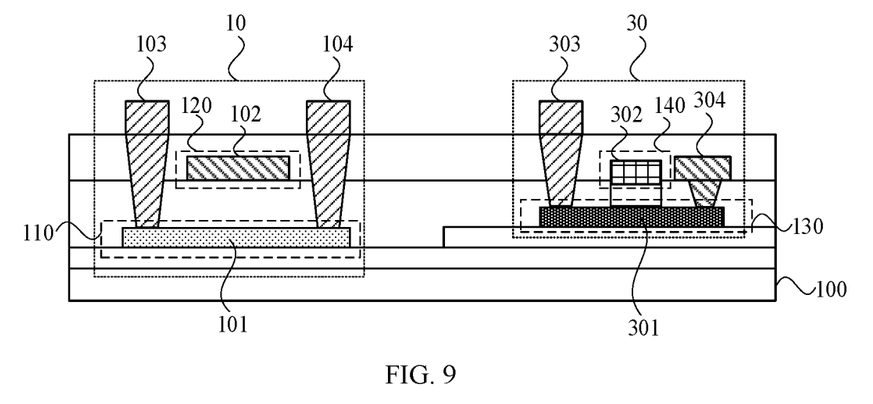
FIG. 9 is a cross-sectional view of FIG. 8 taken along line BB'.

FIG. 8 is a partial structural diagram of another array substrate according to an embodiment of the present disclosure, and FIG. 9 is a cross-sectional view of FIG. 8 taken along line BB'. Referring to FIGS. 8 and 9, in one embodiment of the present disclosure, an array substrate provided in the embodiment of the present disclosure further includes a second semiconductor layer 130 and a second metal layer 140, where the second semiconductor layer 130 includes the active layer of the transistor in the first switching device 30 and the active layer of the transistor in the second switching device 40, and the second metal layer 140 includes a gate electrode of the transistor in the first switching device 30 and a gate electrode of the transistor in the second switching device 40.

Referring to FIG. 9, the first transistor 10 includes the first active layer 101, the first gate electrode 102, the first source electrode 103, and the first drain electrode 104, and the transistor of the first switching device 30 includes the second active layer 301, the second gate electrode 302, the second source electrode 303 and the second drain electrode 304, where the first active layer 101 is located at the first semiconductor layer 110, the second active layer 301 is located at the semiconductor layer 130, the first gate electrode 102 is located at the first metal layer 130, and the second gate electrode 302 is located at the second metal layer 140. It is merely schematic that a distance between the second semiconductor layer 130 and the substrate 100 is greater than a distance between the first semiconductor layer 110 and the substrate 100 in FIG. 9. In other embodiments, the distance between the first semiconductor layer 110 and the substrate 100 may be designed to be greater than the distance between the second semiconductor layer 130 and the substrate 100. In specific implementation, the first semiconductor layer 110 may be provided as the low temperature poly-silicon material, the second semiconductor layer 130 may be provided as the metal oxide semiconductor material, and the first semiconductor layer 110 may also be provided as the metal oxide semiconductor material, and the second semiconductor layer 130 may also be provided as the low temperature poly-silicon material, which are limited in the embodiment.

It is to be noted that it is merely schematic that the transistors shown in FIGS. 6 to 9 are top-gate structures, and in other embodiments, each transistor may also use a bottom-gate structure. A flexible selection may be made in specific implementation according to actual requirements.

Figure 10:
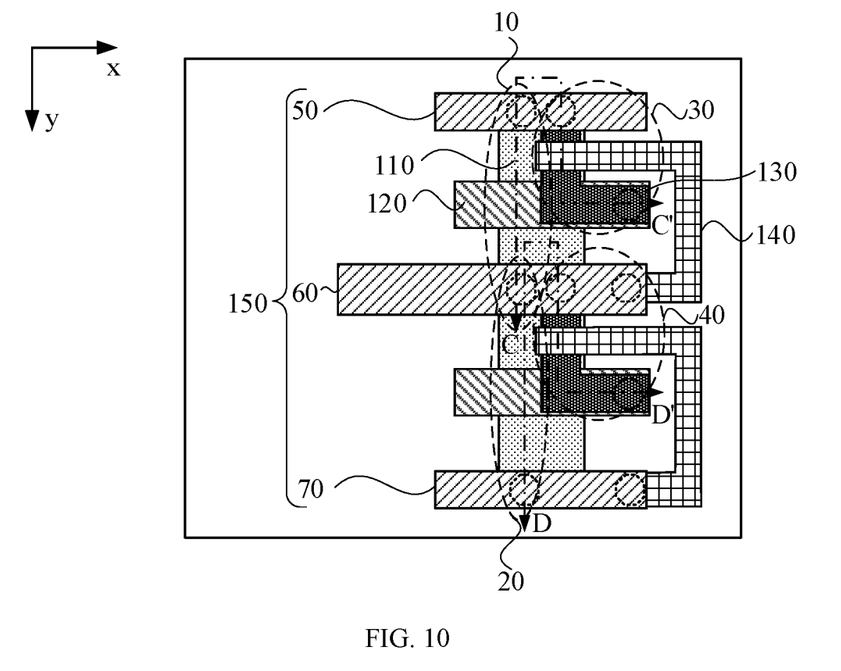
FIG. 10 is a partial structural diagram of another array substrate according to an embodiment of the present disclosure.
Figure 11:
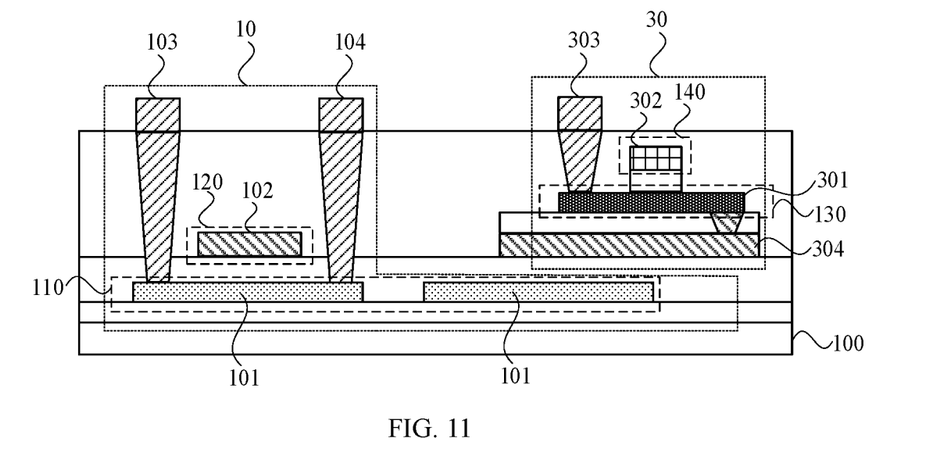
FIG. 11 is a cross-sectional view of FIG. 10 taken along line CC'.
Figure 12:
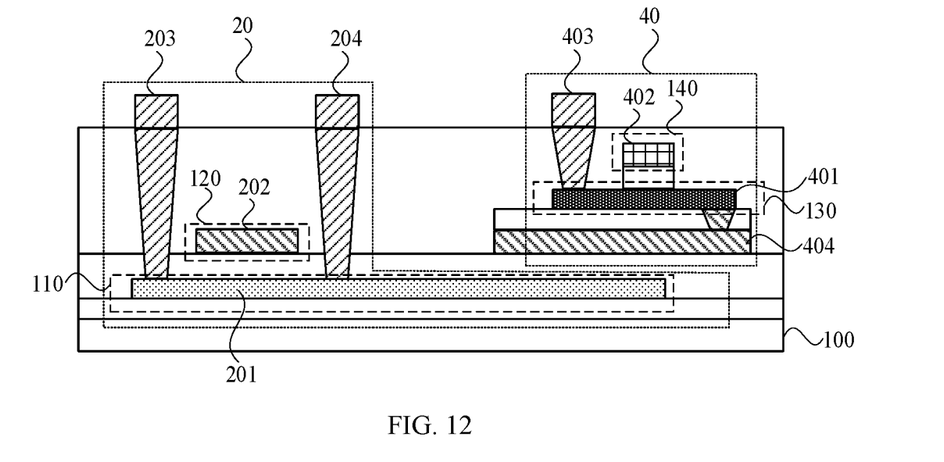
FIG. 12 is a cross-sectional view of FIG. 10 taken along line DD'.

FIG. 10 is a partial structural diagram of another array substrate according to an embodiment of the present disclosure, FIG. 11 is a cross-sectional view of FIG. 10 taken along line CC', and FIG. 12 is a cross-sectional view of FIG. 10 taken along line DD'. FIG. 10 schematically shows a top view of an electro-static discharge circuit, and a case where the first switching device 30 and the second switching device 40 each include one N-type transistor is taken as an example. Referring to FIG. 11, the first transistor 10 includes the first active layer 101, the first gate electrode 102, the first source electrode 103, and the first drain electrode 104, and the transistor of the first switching device 30 includes the second active layer 301, the second gate electrode 302, the second source electrode 303 and the second drain electrode 304. Referring to FIG. 12 which is similar to FIG. 11, the second transistor 20 includes a third active layer 201, a third gate electrode 202, a third source electrode 203 and a third drain electrode 204, and the transistor of the second switching device 40 includes a fourth active layer 401, a fourth gate electrode 402, a fourth source electrode 403 and a fourth drain electrode 404. The first active layer 101 and the third active layer 201 each are located at the first semiconductor layer, the second active layer 301 and the fourth active layer 401 each are located at the second semiconductor layer, the first gate electrode 102 and the third gate electrode 202 each are located at the first metal layer, and the second gate electrode 302 and the fourth gate electrode 402 each are located at the second metal layer. In one embodiment of the present disclosure, referring to FIG. 11, in a direction perpendicular to the substrate 100, the active layer of the first transistor 10 at least partially overlaps the active layer of the transistor in the first switching device 30. Referring to FIG. 12, in one embodiment of the present disclosure, in a direction perpendicular to the substrate 100, the active layer of the second transistor 20 at least partially overlaps the active layer of the transistor in the second switching device 40. Active layers located at different layers are designed to be partially overlapped by adopting a tridimensional thin film transistor structure, so that the occupied area of the electro-static discharge circuit structure on the array substrate can be reduced.

It is to be noted that it is merely schematic that the active layer of the first transistor 10 shown in FIG. 11 is located between the active layer of the first switching device 30 and the substrate 100. In other embodiments, the active layer of the first switching device 30 may also be located between the active layer of the first transistor 10 and the substrate, and each transistor may be the top-gate transistor or the bottom-gate transistor. A selection may be made in specific implementation according to actual requirements.

With continued reference to FIGS. 5, 8 and 10, in one embodiment of the present disclosure, an array substrate provided in the embodiment further includes a third metal layer 150, where a signal line 60, a first level line 50 and a second level line 70 are disposed on the third metal layer 150; the signal line 60, the first level line 50 and the second level line 70 extend in a first direction x and are arranged in a second direction y; the first direction x intersects the second direction y; the first transistor 10 and the first switching device 30 are located between the signal line 60 and the first level line 50, and the first transistor 10 and the first switching device 30 are arranged in the first direction x; the second transistor 20 and the second switching device 40 are located between the signal line 60 and the second level line 70, and the second transistor 20 and the second switching device 40 are arranged in the first direction x.

The active layer of the first transistor 10 at least partially overlaps the active layer of the transistor in the first switching device 30, the active layer of the second transistor 20 at least partially overlaps the active layer of the transistor in the second switching device 40, the first transistor 10 and the first switching device 30 are located between the signal line 60 and the first level line 50, and the second transistor 20 and the second switching device 40 are located between the signal line 60 and the second level line 70, so that on one hand, the arrangement of each level line and each thin film transistor is compact, which is beneficial for reducing the occupied space of the circuit structure on the display panel, and on the other hand, an electro-static discharge circuit of a tridimensional structure can be formed, and space is saved. Since the electro-static discharge circuit is generally arranged in the non-display region around the array substrate, a design of the tridimensional structure is beneficial for achieving a narrow border frame of the display panel.

Figure 13:
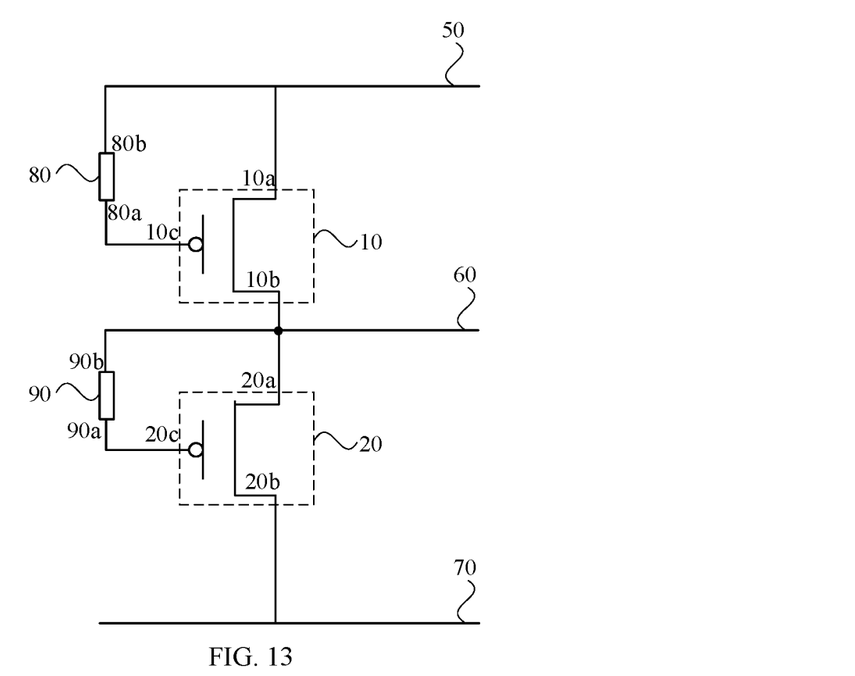
FIG. 13 is a structural diagram of another electro-static discharge circuit according to an embodiment of the present disclosure.

FIG. 13 is a structural diagram of another electro-static discharge circuit according to an embodiment of the present disclosure. Referring to FIG. 13, an electro-static discharge circuit provided in the embodiment includes a first transistor 10, a second transistor 20, a first resistor 80 and a second resistor 90; a first end 10a of the first transistor 10 is electrically connected to a first level line 50, a second end 10b of the first transistor 10 is electrically connected to a signal line 60, a control end 10c of the first transistor 10 is electrically connected to a first end 80a of the first resistor 80, and a second end 80b of the first resistor 80 is electrically connected to the first level line 50; a first end 20a of the second transistor 20 is electrically connected to the signal line 60, a second end 20b of the second transistor 20 is electrically connected to a second level line 70, a control end 20c of the second transistor 20 is electrically connected to a first end 90a of the second resistor 90, and a second end 90b of the second resistor 90 is electrically connected to the signal line 60. The first transistor 10 and the second transistor 20 each may be an LTPS-TFT, and the first resistor 80 and the second resistor 90 may use IGZO due to the fact that the resistance of the IGZO is larger than the resistance of the LTPS, the voltage division effect is good, and compared with the LTPS-formed resistor, the length can be reduced, and space is saved.

Figure 14:
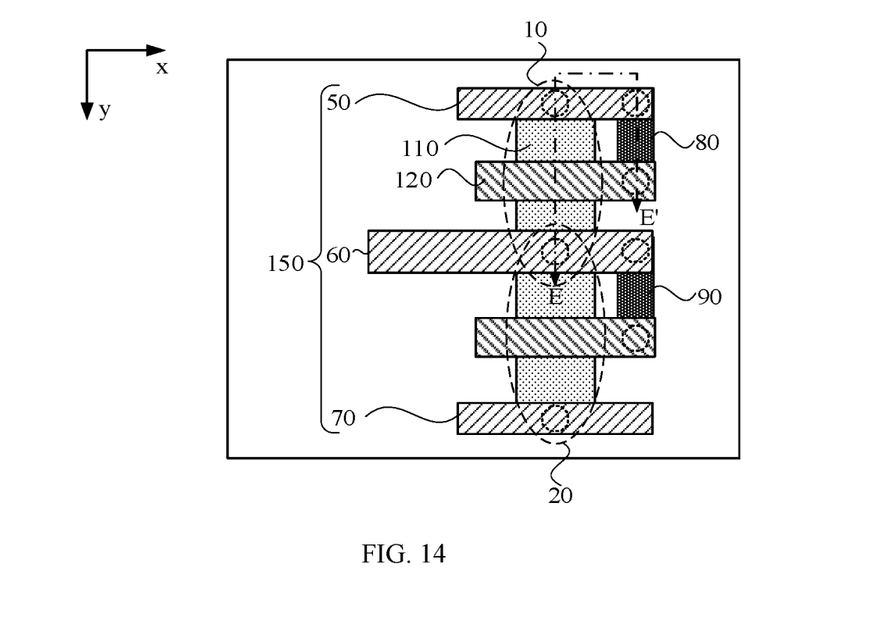
FIG. 14 is a partial structural diagram of another array substrate according to an embodiment of the present disclosure.
Figure 15:
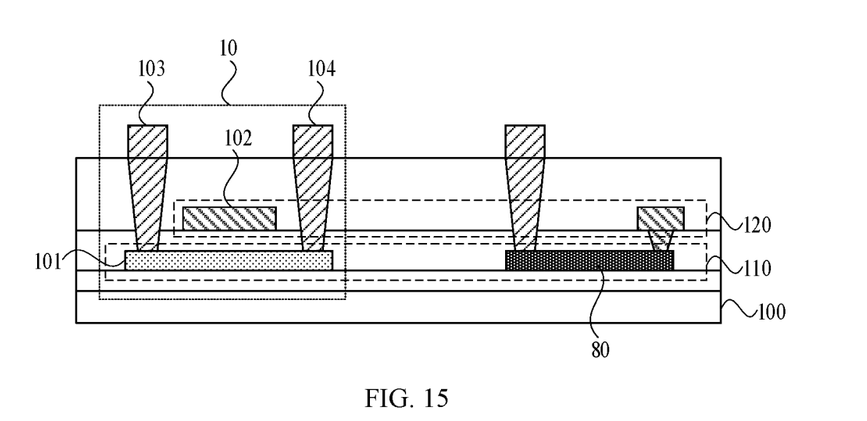
FIG. 15 is a cross-sectional view of FIG. 14 taken along line EE'.

FIG. 14 is a partial structural diagram of another array substrate according to an embodiment of the present disclosure, and FIG. 15 is a cross-sectional view of FIG. 14 taken along line EE'. FIG. 15 exemplarily shows that the active layer of the first transistor 10 and the IGZO of the first resistor 80 are arranged at the same layer. In other embodiment, the active layer of the first transistor 10 and the IGZO of the first resistor 80 may also be arranged at different layers.

A display panel is further provided in the embodiments of the present disclosure and includes any one of the array substrates provided in the embodiments described above. The display panel provided in the embodiment may be an organic light-emitting display panel or may also be a liquid crystal display panel. Since the display panel provided in the embodiment of the present disclosure includes any one of the array substrates provided in the embodiments described above, and the array substrate includes the electro-static discharge circuit described above, the display panel has the same benefits as or corresponding benefits with the electro-static discharge circuit described above.

Figure 16:
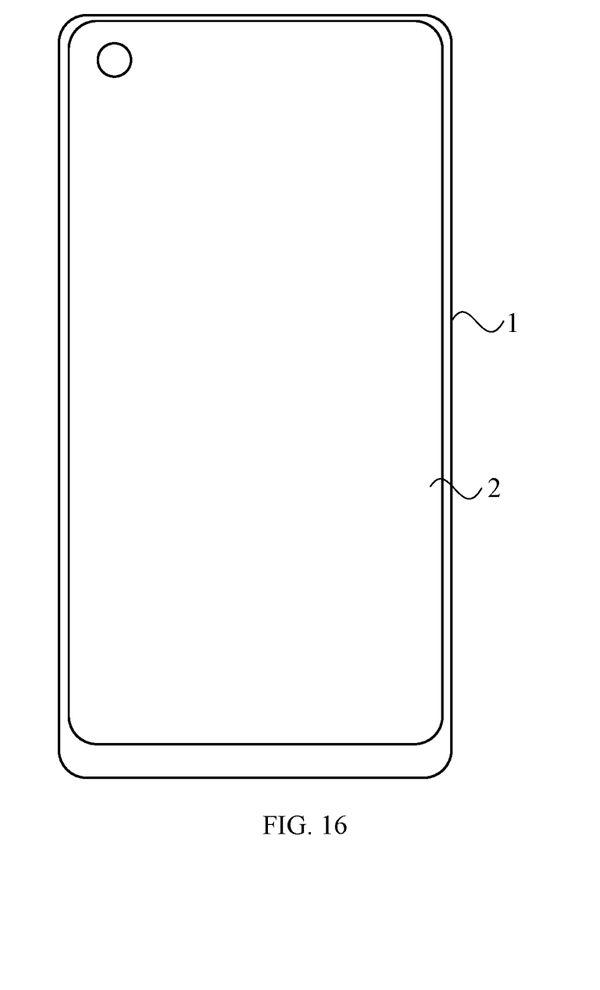
FIG. 16 is a structural diagram of a display apparatus according to an embodiment of the present disclosure.

FIG. 16 is a structural diagram of a display apparatus according to an embodiment of the present disclosure. Referring to FIG. 16, a display apparatus 1 includes any one of the display panels 2 provided in the embodiments of the present disclosure. The display apparatus 1 may be a mobile phone, a computer, an intelligent wearable device, etc.

What is claimed is:

1. An electro-static discharge circuit, comprising:
a first transistor, a second transistor, a first switching device and a second switching device;
wherein a first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line, wherein when the first switching device is conductive, the first transistor discharges charges accumulated on the signal line to the first level line;
wherein a first end of the second transistor is electrically connected to the signal line, a second end of the second transistor is electrically connected to a second level line, a control end of the second transistor is electrically connected to a first end of the second switching device, a second end of the second switching device is electrically connected to the signal line, and a control end of the second switching device is electrically connected to the second level line, wherein when the second switching device is conductive, the second transistor discharges charges accumulated on the signal line to the second level line; and
wherein the signal line comprises a data signal line of a display panel or a scanning signal line of the display panel.

2. The electro-static discharge circuit of claim 1, wherein
the first transistor and the second transistor each are a P-type transistor; and
the first switching device comprises at least one N-type transistor and the second switching device comprises at least one N-type transistor.

3. The electro-static discharge circuit of claim 2, wherein a plurality of N-type transistors in the first switching device are arranged in series or in parallel.

4. The electro-static discharge circuit of claim 2, wherein a plurality of N-type transistors in the second switching device are arranged in series or in parallel.

5. The electro-static discharge circuit of claim 2, wherein an active layer of the first transistor, an active layer of the second transistor, an active layer of each of the at least one N-type transistor in the first switching device, and an active layer of each of the at least one N-type transistor in the second switching device have a same semiconductor material.

6. The electro-static discharge circuit of claim 5, wherein the same semiconductor material is one of low temperature poly-silicon and a metal oxide semiconductor.

7. The electro-static discharge circuit of claim 2, wherein
a semiconductor material of an active layer of the first transistor and a semiconductor material of an active layer of the second transistor each are low temperature poly-silicon, and
a semiconductor material of an active layer of each of the at least one N-type transistor in the first switching device and a semiconductor material of an active layer of each of the at least one N-type transistor in the second switching device each are a metal oxide semiconductor.

8. The electro-static discharge circuit of claim 2, wherein
a semiconductor material of an active layer of the first transistor and a semiconductor material of an active layer of the second transistor each are a metal oxide semiconductor, and
a semiconductor material of an active layer of each of the at least one N-type transistor in the first switching device and a semiconductor material of an active layer of each of the at least one N-type transistor in the second switching device each are low temperature poly-silicon.

9. An array substrate, comprising an electro-static discharge circuit, wherein the electro-static discharge circuit comprises:
a first transistor, a second transistor, a first switching device and a second switching device;
wherein a first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line, wherein when the first switching device is conductive, the first transistor discharges charges accumulated on the signal line to the first level line;
wherein a first end of the second transistor is electrically connected to the signal line, a second end of the second transistor is electrically connected to a second level line, a control end of the second transistor is electrically connected to a first end of the second switching device, a second end of the second switching device is electrically connected to the signal line, and a control end of the second switching device is electrically connected to the second level line, wherein when the second switching device is conductive, the second transistor discharges charges accumulated on the signal line to the second level line; and
wherein the signal line comprises a data signal line of a display panel or a scanning signal line of the display panel.

10. The array substrate of claim 9, comprising a substrate, and a first semiconductor layer and a first metal layer stacked on a side of the substrate;
wherein the first semiconductor layer comprises an active layer of the first transistor and an active layer of the second transistor; and
wherein the first metal layer comprises a gate electrode of the first transistor and a gate electrode of the second transistor.

11. The array substrate of claim 10, wherein
the first semiconductor layer further comprises an active layer of a transistor in the first switching device and an active layer of a transistor in the second switching device; and the first metal layer comprises a gate electrode of the transistor in the first switching device and a gate electrode of the transistor in the second switching device.

12. The array substrate of claim 11, wherein
the active layer of the first transistor, the active layer of the second transistor, the active layer of the transistor in the first switching device and the active layer of the transistor in the second switching device have a same semiconductor material; and
the same semiconductor material is one of low temperature poly-silicon and a metal oxide semiconductor.

13. The array substrate of claim 11, wherein the first semiconductor layer comprises two types of semiconductor materials;
wherein the active layer of the first transistor and the active layer of the second transistor each are low temperature poly-silicon, and semiconductor material of the active layer of the transistor in the first switching device and the semiconductor material of the active layer of the transistor in the second switching device each are a metal oxide semiconductor; or
wherein the active layer of the first transistor and the active layer of the second transistor each are the metal oxide semiconductor, and the active layer of the transistor in the first switching device and the active layer of the transistor in the second switching device each are the low temperature poly-silicon.

14. The array substrate of claim 10, further comprising a second semiconductor layer and a second metal layer;
wherein the second semiconductor layer comprises an active layer of a transistor in the first switching device and an active layer of a transistor in the second switching device; and
wherein the second metal layer comprises a gate electrode of the transistor in the first switching device and a gate electrode of the transistor in the second switching device.

15. The array substrate of claim 14, wherein in a direction perpendicular to the substrate, the active layer of the first transistor at least partially overlaps the active layer of the transistor in the first switching device.

16. The array substrate of claim 14, wherein in a direction perpendicular to the substrate, the active layer of the second transistor at least partially overlaps the active layer of the transistor in the second switching device.

17. The array substrate of claim 14, further comprising a third metal layer,
wherein the signal line, the first level line and the second level line are disposed on the third metal layer, the signal line, the first level line and the second level line are extend in a first direction and are arranged in a second direction, and the first direction intersects the second direction;
wherein the first transistor and the first switching device are located between the signal line and the first level line, and the first transistor and the first switching device are arranged in the first direction; and
wherein the second transistor and the second switching device are located between the signal line and the second level line, and the second transistor and the second switching device are arranged in the first direction.

18. A display apparatus, comprising an array substrate, wherein the array substrate comprises: an electro-static discharge circuit, and the electro-static discharge circuit comprises:
a first transistor, a second transistor, a first switching device and a second switching device;
wherein a first end of the first transistor is electrically connected to a first level line, a second end of the first transistor is electrically connected to a signal line, a control end of the first transistor is electrically connected to a first end of the first switching device, a second end of the first switching device is electrically connected to the first level line, and a control end of the first switching device is electrically connected to the signal line, wherein when the first switching device is conductive, the first transistor discharges charges accumulated on the signal line to the first level line;
wherein a first end of the second transistor is electrically connected to the signal line, a second end of the second transistor is electrically connected to a second level line, a control end of the second transistor is electrically connected to a first end of the second switching device, a second end of the second switching device is electrically connected to the signal line, and a control end of the second switching device is electrically connected to the second level line, wherein when the second switching device is conductive, the second transistor discharges charges accumulated on the signal line to the second level line; and
wherein the signal line comprises a data signal line of a display panel or a scanning signal line of the display panel.

* * * * *